(12) United States Patent
Onoda et al.

(10) Patent No.: US 6,315,840 B1
(45) Date of Patent: Nov. 13, 2001

(54) SLIDING MEMBER

(75) Inventors: Motonobu Onoda; Katsuaki Ogawa; Keiichi Kanemitsu, all of Yono (JP)

(73) Assignee: Nippon Piston Ring Co., Ltd., Tokyo (JP)

( * ) Notice: Subject to any disclaimer, the term of this patent is extended or adjusted under 35 U.S.C. 154(b) by 0 days.

(21) Appl. No.: 09/332,591

(22) Filed: Jun. 14, 1999

(30) Foreign Application Priority Data

Jun. 18, 1998 (JP) .................................................. 10-170929

(51) Int. Cl.$^7$ ....................................................... C23C 8/24
(52) U.S. Cl. ........................ 148/317; 148/530; 148/537; 428/660; 428/457; 428/908.8
(58) Field of Search ................... 148/317, 518, 148/525, 530, 537; 428/660, 666, 457, 908.8

(56) References Cited

U.S. PATENT DOCUMENTS

| 4,412,899 | * | 11/1983 | Beale | .............................. | 204/192 R |
| 5,743,536 | * | 4/1998 | Komuro et al. | ................. | 277/235 A |

FOREIGN PATENT DOCUMENTS

| 407018414 | * | 1/1995 | (JP) . |
| 07150337 A | * | 6/1995 | (JP) . |
| 10068070 A | * | 3/1998 | (JP) . |

OTHER PUBLICATIONS

ASM International Handbook Committee, "ASM Handbook, vol. 18: Friction Lubrication, and Wear Technology", pp. 553–562, Mar. 1995.*

Kappl et al., "Results on the thermal stability of cathodic arc–deposited (Cr,B)N coatings", Surface and Coatings Technology, vol.: 73, Issue:1/2, pp. 14–17, Jul. 1995.*

* cited by examiner

*Primary Examiner*—John Sheehan
*Assistant Examiner*—Andrew L. Oltmans
(74) *Attorney, Agent, or Firm*—Nixon & Vanderhye

(57) ABSTRACT

An object of the present invention is to provide a sliding member which is coated a film having superior wear resistance, superior scuffing resistance and a superior property not to increase an amount of wear on an opponent material (an opponent attacking property). This object can be achieved by providing a sliding member coated by a Cr—B—N alloy film 4 on an outer surface 3 thereof. In this case, it is preferable that the Cr—B—N alloy film is formed through a physical vapor deposition, particularly ion plating, vacuum deposition, or sputtering. Further, it is preferable that the boron (B) content is within the range of 0.05–20 wt.%. Since the Cr—B—N alloy film 4 formed on the outer surface 3 of the sliding member has superior wear resistance, superior scuffing resistance and a superior opponent attacking property, it is possible to provide the sliding member which satisfies demand characteristics even when the sliding member are subjected to the harsh operating environments. Further, it is preferable that nitriding layer 5 is formed on a whole surface or at least an outer surface 3 of the sliding member, and the Cr—B—N alloy film 4 is covered on the nitriding layer 5.

3 Claims, 3 Drawing Sheets

SLIDING MEMBER

BACKGROUND OF THE INVENTION

The present invention relates to a sliding member, particularly, having superior wear resistance, superior scuffing resistance, and a superior property not to increase an amount of wear on an opponent material (hereinafter referred as an opponent attacking property), for example used as a sliding member of an internal-combustion engine.

There have been applied conventional surface treatments such as hard chromium plating and nitriding for surfaces processing for the purpose of improving wear resistance, on a sliding surface of a piston ring as a sliding member for an internal-combustion engine in order to improve durability.

In recent years, since piston rings have been subjected to the increasingly harsh operating environments due to higher engine outputs and lightening of an internal-combustion engine, piston rings which are processed with the conventional surface treatments can not be satisfied a function such as wear resistance sufficiently, For that reason, it is demanded that a sliding member such as a piston ring has a film or is applied a surface treatment, which have a superior quality such as superior wear resistance, superior scuffing resistance, and a superior opponent attacking property.

To respond to these problems, some internal-combustion engines or parts thereof are coated with a hard film such as a film of chromium nitride (CrN) or titanium nitride (TiN) which is prepared through use of a physical vapor deposition (PVD) method, in order to improved wear resistance. These films, however, have a problem such that the films make an amount of wear of a cylinder liner as an opponent material increase on occasion, although the wear resistance thereof is improved.

SUMMARY OF THE INVENTION

An object of the present invention from the above-described point, is to soluble a problem of conventional surface treatments and to provide a sliding member which is coated a film having superior wear resistance, superior scuffing resistance and a superior opponent attacking property.

This object can be achieved according to the present invention by providing a sliding member coated by an alloy film of chrome (Cr) - boron (B) - nitrogen (N) on the outer surface thereof. In this case, it is preferable that the Cr—B—N alloy film is formed through use of a physical vapor deposition, particularly ion plating, vacuum deposition, or sputtering. Further, it is preferable that the boron (B) content is within the range of 0.05–20 wt.%. According to the present invention, since the Cr—B—N alloy film formed on the outer surface of the sliding member has superior wear resistance, superior scuffing resistance and a superior opponent attacking property, it is possible to provide the sliding member which satisfies demand characteristics even when the sliding member are subjected to the harsh operating environments.

Further, it is preferable that nitriding layer is formed on a whole surface or at least an outer surface of the sliding member, and the Cr—B—N alloy film is covered on the nitriding layer. According to the present invention, since the hard nitriding layer is formed on the surface of the sliding member, the sliding member becomes to have more excellent properties concerning wear resistance, scuffing resistance and an opponent attacking property, combined with the effect of coated with the Cr—B—N alloy film.

According to the sliding member of the present invention, since the Cr—B—N alloy film is formed on a sliding surface of the sliding member, the sliding member has more excellent effect or function concerning wear resistance, scuffing resistance and an opponent attacking property, than the siding member made practicable partially, which has an Cr—N alloy film.

The sliding member according to the present invention can apply to a high-powered engine, and a high temperature/high intensity engine which is expected to be developed in future.

DESCRIPTION OF THE PREFERRED EMBODIMENTS

Figure 1A:
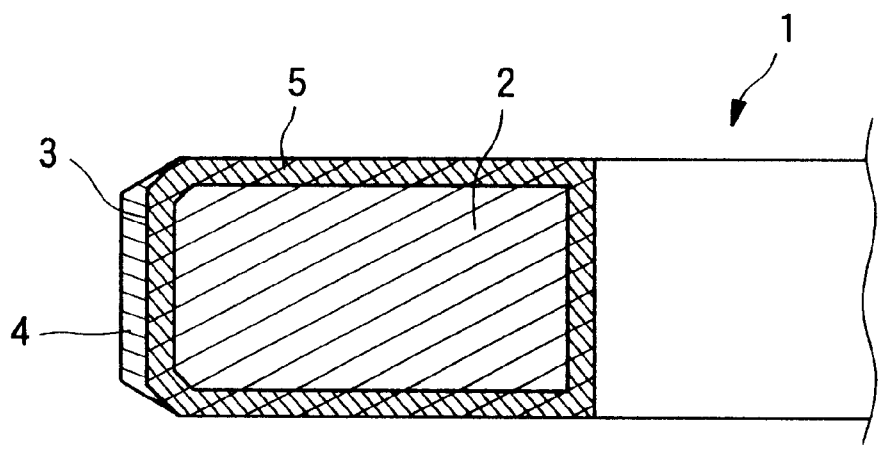
FIG. 1A is an expanded sectional view of one example of a sliding member for an internal-combustion engine according to the present invention.
Figure 1B:
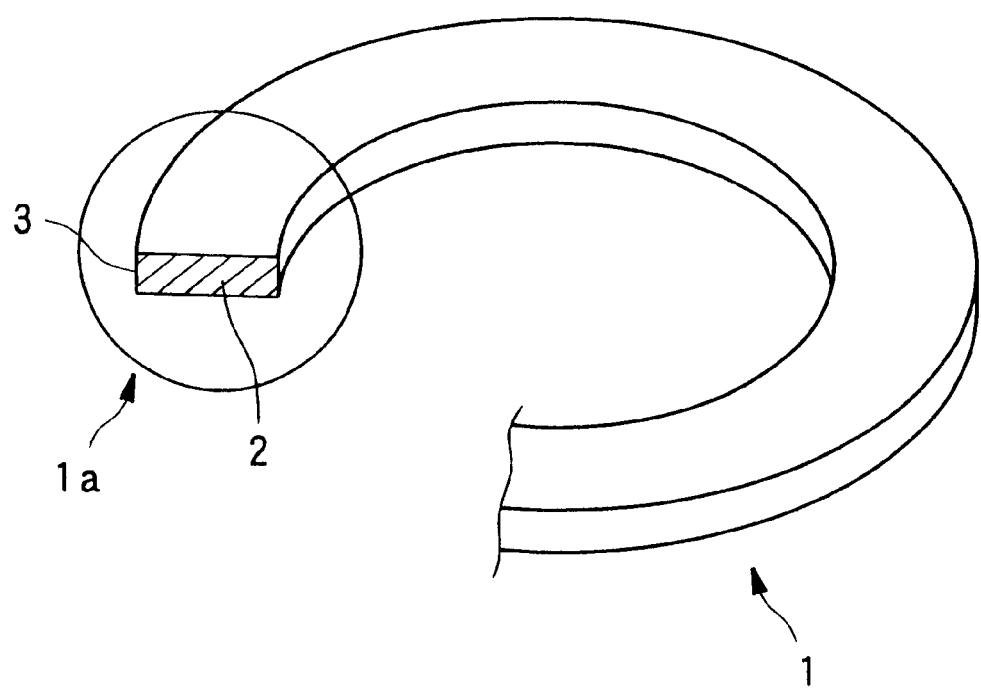
FIG. 1B is a perspective view of the partially broken sliding member shown in FIG. 1A.

FIG. 1 shows a structure of a piston ring 1 which is one example of a sliding member for an internal-combustion engine, in which FIG. 1A is a expanded view of 1a in FIG. 1B, and FIG. 1B is a perspective view showing a partially broken surface 1a of the piston ring 1. There is formed a Cr—B—N alloy film 4 on an outer peripheral surface 3 of a base material 2 of the piston ring 1. Although, hereinafter, the sliding member according to the present invention will be explained as a piston ring, the sliding member can be, for example, automotive parts or compressor parts, and is not limited to the piston ring.

Stainless steel or nitriding stainless steel is generally used for the base material 2 of the piston ring 1. Since a hard nitriding layer 5 can be formed through diffusion-carburizing nitrogen in a surface of the stainless steel by nitriding, it is preferably used as a sliding member such as, especially, piston ring 1. The nitriding can be conducted through a conventional method.

The Cr—B—N alloy film 4 is preferably formed on the outer peripheral surface 3 of the piston ring 1. Since the outer peripheral surface 3 of the piston ring 1 comes into contact with a cylinder liner as an opponent material during sliding, the piston ring 1 becomes to have superior wear resistance, superior scuffing resistance, and a superior opponent attacking property through forming the Cr—B—N alloy film 4 on at least the outer peripheral surface 3. It is possible to form the Cr—B—N alloy film 4 on the surface besides the outer peripheral surface 3, accordingly it is not limited where the Cr—B—N alloy film 4 is formed. Further, the Cr—B—N alloy film 4 especially has a superior opponent attacking property to the opponent material such as a cylinder liner formed of cast iron or aluminum alloy, accordingly it is preferably applied to the sliding member which is used with the above described opponent member.

The Cr—B—N alloy film 4 is generally formed by PVD (physical vapor deposition) on the outer peripheral surface 3 of the piston ring 1. Ion plating, vacuum deposition or sputtering is used in PVD. The thickness of the Cr—B—N alloy film 4 to be formed is preferable within the range of 1–70 μm generally, but it is not limited.

It is preferable that the obtained Cr—B—N alloy film 4 contains B (Boron) within the range of 0.05–20 wt.%. The Cr—B—N alloy film 4 formed through containing B (Boron) in Cr—N alloy especially has a superior opponent attacking property as well as superior wear resistance and scuffing resistance. When the B (Boron) content is less than 0.05 wt.%, the expected effect concerning scuffing resistance and an opponent attacking property can not be obtained. When the B content is more than 20 wt.%, the piston ring becomes not to fulfill its function because the alloy film 4 has high internal stress, and toughness of the alloy film 4 goes down, thus, cracks and separation between layers generate in the alloy film 4. The particularly preferable range of the B (Boron) content is within 0.5–12 wt.%.

The Cr content in the Cr—B—N alloy film 4 is preferably within the range of 78.4–69.3 wt.%, andtheNcontent is preferably within the range of 21.1–18.7 wt.%.

EXAMPLE

Hereunder, the present invention will be more concretely explained by way of preferred examples executed.

For a start, the lapping was conducted on one side of a flat steel sheet having a size of 18 mm×12 mm×6 mm, then it was finished so as to have a surface roughness of not more than 1 μm, and used as a test sample. The ultrasonic cleaning was conducted, in advance, to thus-obtained sample in the organic solvent. Next, the Cr—B—N alloy film 4 was formed through the arc ion plating according to following steps.

(Steps for Forming the Cr—B—N Alloy Film)

The sample was fixed in the chamber (vacuum vessel) of the arc ion plating device. The chamber was vacuumed to $5 \times 10^{-3}$ Torr. The gas adhered or adsorbed on the surface of the sample was released through heating by means of the built-in heater in the chamber. Cr—B alloy having predetermined composition is used as a target. The arc discharge was generated on the surface thereof, then the Cr and B ion were released. Sputter-cleaning (ion bombardment) was conducted on the surface of the sample through applying the voltage of –800V to the sample. After that, the nitrogen gas was introduced to the chamber where the arc discharge was generated, then the Cr—B—N alloy film 4 having the thickness of 20 μm was formed on the surface of the sample through applying the bias voltage of –50V to the sample.

The Cr—B—N alloy films 4 having varied B (Boron) content were formed through use of the Cr—B alloy target having the different composition. There were formed the test samples (Example of the present invention) on which the Cr—B—N alloy films 4 having B (Boron) content of 0.05 wt.%, 10 wt.%, 20 wt.%, and 30 wt.% were formed, according to the above described method.

(Wearing Test)

The evaluation of the wear resistance was conducted under the following wearing test condition using the test sample formed through the above-described process. The sample made partial practicable, on which the Cr—N alloy film was, was also evaluated as the comparative sample formed (Comparative Example).

Figure 2:
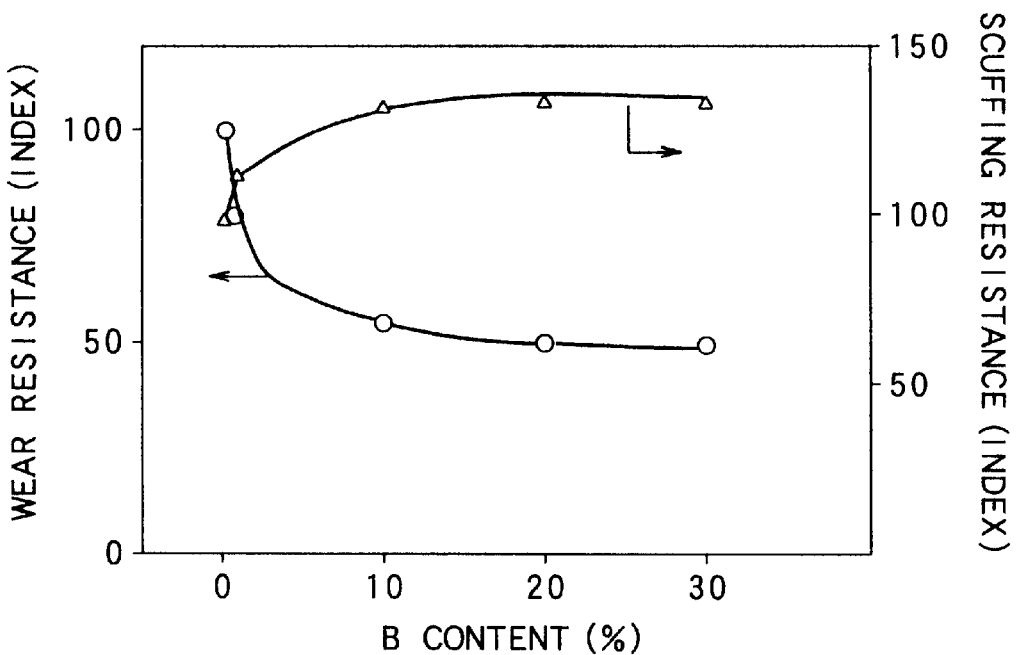
FIG. 2 is a graph showing wear resistance (a wear resistance index) and scuffing resistance (a scuffing resistance index)

The wearing test was conducted through use of Amsler type wearing testing machine. The test samples and the comparative samples (each of them having the size of 18 mm×12 mm×6 mm) is used as a fixed piece, and a doughnut shaped material (an external diameter: 40 mm, aninternal-diameter: 16 mm, and a thickness; 10 mm) was used as an opponent material (a rotatory piece). The test sample and the comparative sample were arranged such that the formed alloy film came into contact with the doughnut shaped rotatory piece. The results of the test were shown in FIG. 2. The wear resistance was evaluated through use of the wear resistance index against the comparative sample, which is shown by the wearing loss of the test sample (Example of the present invention) when the wearing loss of the comparative sample (Comparative Example) was assumed 100. As shown in FIG. 2, the wear resistance index of the test sample (Example of the present invention) is less than 100. It shows that the wearing loss of the test sample (Example of the present invention) was less than the wearing loss of the comparative sample (Comparative Example). Accordingly, it is clear that the test sample (Example of the present invention) has more excellent wear resistance than the wear resistance of the comparative sample (Comparative Example).

Figure 3:
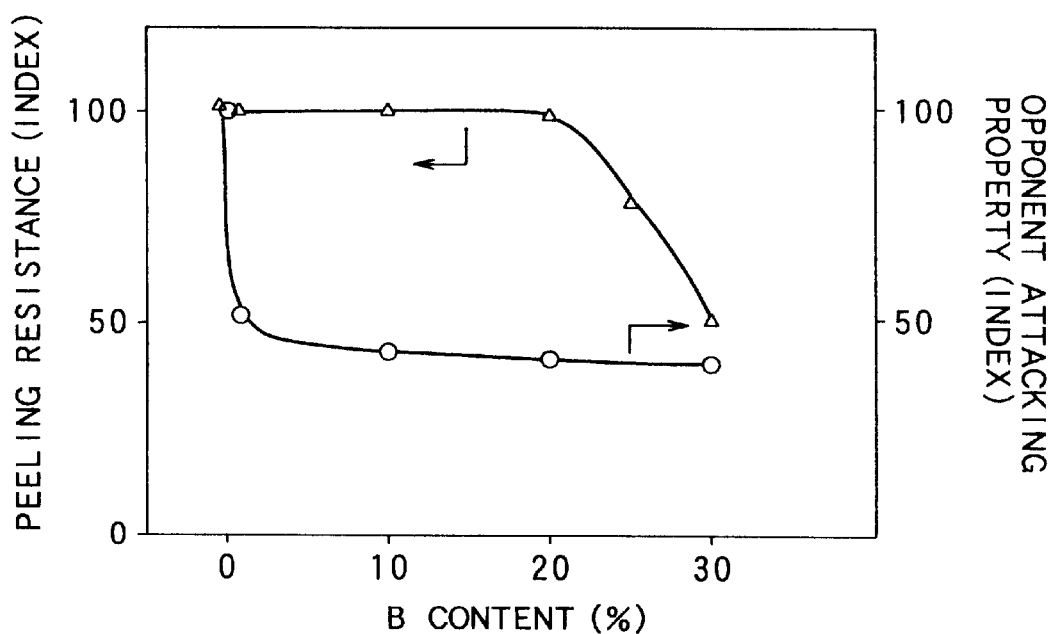
FIG. 3 is a graph showing pealing resistance (a peeling resistance index) and an opponent attacking property (an opponent attacking property index)

At this time, an opponent attacking property was evaluated through measuring the wearing loss of the rotatory piece that is the opponent material. Similar to the wear resistance, the opponent attacking property was evaluated through use of the index which is shown by the wearing loss of the rotatory piece using with the test sample (Example of the present invention) when the wearing loss of the rotatory piece using with the comparative sample (Comparative Example) was assumed 100. As shown in FIG. 3, the index of the rotatory piece using with the test sample (Example of the present invention) is less than 100. It showed that the wearing loss of the rotatory piece using with the test sample (Example of the present invention) was less than the wearing loss of the rotatory piece using with the comparative sample (Comparative Example). Accordingly, it is clear that the test sample (Example of the present invention) has more excellent opponent attacking property than the same of the comparative sample (Comparative Example).

Condition for Wearing Test;

Testing machine: Amsler type wearing testing machine.

Method: The wearing test was conducted such that about a half of the rotatory piece was dipped in the oil, the fixed piece came into contact with the rotatory piece, and the weight was loaded.

Opponent Material: FC25 (HRB98).

Lubricating Oil: Bearing oil.

Oil Temperature: 80° C.

Circumferential speed: 1 m/sec (478 rpm).

Load: 150 kg.

Time: 7 Hr.

Measurement of wearing loss: Wearing lass (μm) was measured by means of a profile of a difference in level.

(Scuffing Resistance Test)

The scuffing resistance was evaluated through use of the above-described test sample (Example of the present invention) and the comparative sample (Comparative Example), under the following condition for the scuffing resistance test. The result of the test was shown in FIG. 2. The scuffing resistance index was used for evaluating the scuffing resistance. The scuffing resistance index is shown by the scuff-generating load of the test sample (Example of the present invention) when the scuff-generating load of the comparative sample (Comparative Example) was assumed 100. Accordingly, in case the scuffing resistance index of the test sample is more than 100, it means that the scuff-generating load of the test sample is larger than the same of the comparative sample. Thus, as shown in FIG. 2, the test sample (Example of the present invention) has more excellent scuffing resistance than the scuffing resistance of the comparative sample (Comparative Example).

Condition for Scuffing Resistance Test;
Testing machine: Amsler type wearing testing machine.
Method: The scuffing resistance test was conducted such that the lubricating oil was adhered to the test piece, and the weight was loaded until a scuff is generated
Opponent Material: FC25 (HRB98).
Lubricating Oil: Spindle oil No. 2.
Oil Temperature: The course of events.
Circumferential speed: 1 m/sec (478 rpm).
Load: Until a scuff is generated.
Time: The course of events.

(Peeling Test)

Figure 4A:
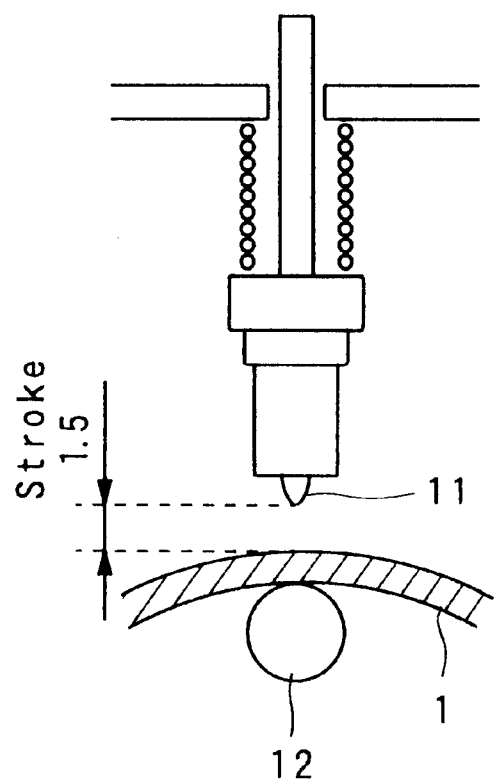
FIGS. 4A and 4B are a schematically sectional view showing the peeling resistance test using the NPR type impact-testing device.
Figure 4B:
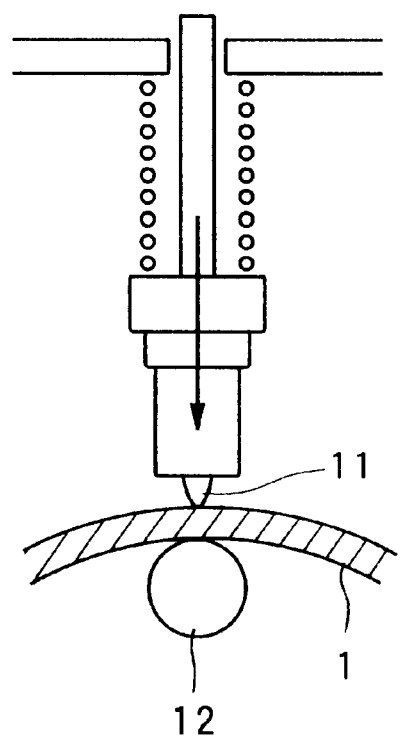

The peeling test was evaluated through use of the above-described test sample (Example of the present invention) and the comparative sample (Comparative Example), under the following condition for the peeling test. The results of the test were shown in FIG. 3. The peeling resistance (index) was used for evaluating the peeling resistance. The peeling resistance (index) is shown by the peeling generating times of the test sample (Example of the present invention), when the peeling generating times of the comparative sample (Comparative Example) was assumed 100. Accordingly, in case the peeling resistance (index) of the test sample is less than 100, it means that the peeling resistance of the test sample (Example of the present invention) is inferior to the comparative sample (Comparative Example), because the peeling is generated in the test sample at the times less than the times when the peeling is generated in the comparative sample. The NPR Type impact-testing device is shown in FIGS. 4A and 4B.

Condition for Peeing Test;
Testing machine: The improved testing device of the NPR Type impact-testing device (illustrated in Japan Patent Publication No. 36-19604, Quantitative-testing device for measuring a degree of plating adhesion)
Method: The evaluation was conducted to measure the times until the peeling generates, in case the impact energy which was 43.1 mJ (44 kg/mm) per time was added to the surface of the PVD alloy film.

Existence of peeling: Observation of the 15 times expanded surface.

(Results of the Test)

With regard to the test sample (Example of the present invention) on which the Cr—B—N alloy film 4 containing B content of 0.05 wt.% was formed, it was shown that the wear resistance index and the opponent attacking property (index) decreased, and the scuffing resistance index increased, thus the test sample was superior concerning the wear resistance, the scuffing resistance, and the opponent attacking property.

With regard to the test sample (Example of the present invention) on which the Cr—B—N alloy film 4 containing B (boron) content of more than 20 wt.% was formed, the peeling resistance (index) decreased, thus the peeling resistance was inferior.

Accordingly, with regard to the test sample (Example of the present invention) on which the Cr—B—N alloy film 4 containing B content of 0.05–20 wt.% was formed, surpassed the every properties of the wear resistance, the scuffing resistance, the opponent attacking property, and the peeling resistance.

What is claimed is:

1. A sliding mechanism of an internal combustion engine comprising a cylinder liner formed of iron or aluminum alloy, and a piston ring coming into contact with the cylinder liner, wherein at least an outer surface of the piston ring which comes into contact with the cylinder liner is covered with a Cr—B—N alloy film formed on a nitriding layer, wherein the B content of the alloy film is within a range of 0.05 to 20 wt.%, whereby the peeling resistance of the Cr—B—N alloy film is improved.

2. The sliding mechanism according to claim 1, wherein the Cr—B—N alloy film is formed by physical vapor deposition.

3. The sliding mechanism according to claim 2, wherein the physical vapor deposition is by a method selected from the group consisting of ion plating, vacuum deposition and sputtering.

* * * * *